United States Patent
Thesling, III (10) Patent No.: US 7,107,505 B2
(45) Date of Patent: Sep. 12, 2006

(54) CONCATENATED TURBO PRODUCT CODES FOR HIGH PERFORMANCE SATELLITE AND TERRESTRIAL COMMUNICATIONS

(75) Inventor: William H. Thesling, III, Bedford, OH (US)

(73) Assignee: Comtech AHA Corporation, Moscow, ID (US)

( * ) Notice: Subject to any disclaimer, the term of this patent is extended or adjusted under 35 U.S.C. 154(b) by 473 days.

(21) Appl. No.: 10/109,315

(22) Filed: Mar. 27, 2002

(65) Prior Publication Data

US 2002/0162072 A1    Oct. 31, 2002

Related U.S. Application Data

(60) Provisional application No. 60/279,180, filed on Mar. 27, 2001.

(51) Int. Cl.
H03M 13/00     (2006.01)

(52) U.S. Cl. .................. 714/755; 714/786; 714/701; 714/777; 714/762; 714/788

(58) Field of Classification Search ............... 714/755, 714/757, 777, 786, 792, 795, 800, 701; 341/50
See application file for complete search history.

(56) References Cited

U.S. PATENT DOCUMENTS

| | | | |
|---|---|---|---|
| 4,559,625 A * | 12/1985 | Berlekamp et al. ......... 714/701 |
| 4,564,945 A | 1/1986 | Glover et al. |
| 5,369,652 A | 11/1994 | Bailey et al. |
| 5,898,698 A * | 4/1999 | Bross ......................... 714/701 |
| 5,930,272 A | 7/1999 | Thesling |
| 6,029,264 A * | 2/2000 | Kobayashi et al. ......... 714/755 |
| 6,367,047 B1 | 4/2002 | McAuliffe et al. .......... 714/755 |
| 6,745,362 B1 * | 6/2004 | Carlach et al. ............. 714/755 |
| 2001/0050622 A1 * | 12/2001 | Hewitt et al. ................. 341/50 |

OTHER PUBLICATIONS

W.H. Thesling and F. Xiong, "Pragmatic Approach to Soft-Decision Decoding of Linear Block Codes," IEE Proc.-Commun., vol. 142, No. 1, Feb. 1995, pp. 40-47.

* cited by examiner

Primary Examiner—Guy J. Lamarre
(74) Attorney, Agent, or Firm—Haverstock & Owens LLP (57) ABSTRACT

Architecture for enhancing the encoding/decoding of information of a channel. A stream of incoming information bits are arranged into a first array of information bits. The first array of information bits are processed into a first code of bits, which bits form a plurality of first code words having a minimum distance to neighboring error events. Selected bits of the first code are rearranged into a second array of bits by intermittent successive rotations of the selected bits of the first code. A second code is then generated from the second array of bits to increase the minimum distance to the neighboring error events.

3 Claims, 11 Drawing Sheets

| 1 | 2 | 3 | 4 | 5 | 6 | 7 | 8 | 9 | 10 | 11 |
|---|---|---|---|---|---|---|---|---|---|---|
| 12 | 13 | 14 | 15 | 16 | 17 | 18 | 19 | 20 | 21 | 22 |
| 23 | 24 | 25 | 26 | 27 | 28 | 29 | 30 | 31 | 32 | 33 |
| 34 | 35 | 36 | 37 | 38 | 39 | 40 | 41 | 42 | 43 | 44 |
| 45 | 46 | 47 | 48 | 49 | 50 | 51 | 52 | 53 | 54 | 55 |
| 56 | 57 | 58 | 59 | 60 | 61 | 62 | 63 | 64 | 65 | 66 |
| 67 | 68 | 69 | 70 | 71 | 72 | 73 | 74 | 75 | 76 | 77 |
| 78 | 79 | 80 | 81 | 82 | 83 | 84 | 85 | 86 | 87 | 88 |
| 89 | 90 | 91 | 92 | 93 | 94 | 95 | 96 | 97 | 98 | 99 |
| 100 | 101 | 102 | 103 | 104 | 105 | 106 | 107 | 108 | 109 | 110 |
| 111 | 112 | 113 | 114 | 115 | 116 | 117 | 118 | 119 | 120 | 121 |

FIG. 17

| 7 | 112 | 107 | 91 | 86 | 70 | 65 | 49 | 44 | 28 | 12 |
|---|---|---|---|---|---|---|---|---|---|---|
| 13 | 8 | 113 | 108 | 92 | 87 | 71 | 66 | 50 | 34 | 29 |
| 30 | 14 | 9 | 114 | 109 | 93 | 88 | 72 | 56 | 51 | 35 |
| 36 | 31 | 15 | 10 | 115 | 110 | 94 | 78 | 73 | 57 | 52 |
| 53 | 37 | 32 | 16 | 11 | 116 | 100 | 95 | 79 | 74 | 58 |
| 59 | 54 | 38 | 33 | 17 | 1 | 117 | 01 | 96 | 80 | 75 |
| 76 | 60 | 55 | 39 | 23 | 18 | 2 | 118 | 102 | 97 | 81 |
| 82 | 77 | 61 | 45 | 40 | 24 | 19 | 3 | 119 | 103 | 98 |
| 99 | 83 | 67 | 62 | 46 | 41 | 25 | 20 | 4 | 120 | 104 |
| 105 | 89 | 84 | 68 | 63 | 47 | 42 | 26 | 21 | 5 | 121 |
| 111 | 106 | 90 | 85 | 69 | 64 | 48 | 43 | 27 | 22 | 6 |

CONCATENATED TURBO PRODUCT CODES FOR HIGH PERFORMANCE SATELLITE AND TERRESTRIAL COMMUNICATIONS

This application claims priority under 35 U.S.C. § 119(e) from U.S. Provisional Patent Application Ser. No. 60/279,180 entitled "Concatenated Turbo Product Codes for High Performance Satellite and Terrestrial Communications" and filed Mar. 27, 2001.

BACKGROUND OF THE INVENTION

1. Technical Field of the Invention

This invention is related to turbo codes, and more specifically, architecture for iterative processing of a channel of information using a second concatenated turbo code generated from a first turbo code.

2. Description of the Related Art

Digital communications links are used for the efficient and flexible transmission of a wide range of data services. In general, as these services and their supporting networks migrate towards higher rates, and more bursty packet oriented structures, it is important that the physical layer have both access techniques and modulation/coding techniques to efficiently convey this type of data. This is especially important in many applications in which both bandwidth and power are limited resources. Many industry forums and regulatory bodies have concluded that technology advances in power and spectrum efficiency are needed to support the projected use of these services.

Figure 1:
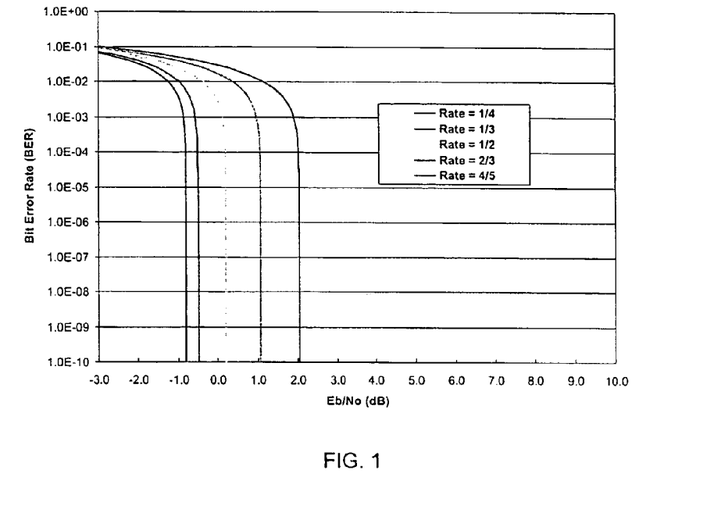
FIG. 1 illustrates a graph of the theoretical limits defined by Shannon's Channel Capacity Theorem on several conventional code rates.

It is widely accepted that Forward Error Correction (FEC) is a valuable technique to increase power and spectrum efficiency, and thus will have an important role in these systems. However, the development of FEC with increased coding gain and decreased overhead does have a limit. This limit arises from Shannon's Channel Capacity theorem (published in a 1948 paper entitled "A Mathematical Theory of Communication") that states that the Bit Error Rate (BER) performance of any rate code will be bounded. This bound is illustrated in FIG. 1, and shows that the maximum coding performance that can be achieved on the antipodal channel for a variety of code rates, e.g., ¼, ⅓, ½, ⅔, and ⅘. No codes can perform better than this theoretical maximum. This also holds for any concatenation of codes.

The task of the code designer then is to develop a codec (an encoder and decoder pair) that exhibits a performance curve that is as close as possible to Shannon's theoretical maximum. However, another implication of the capacity theorem is that the closer the code is to the theoretical maximum, the more complex it will to become to implement.

What is needed is an algorithm that encodes/decodes information bits in a way that approaches the theoretical channel capacity, but is still practical to implement.

SUMMARY OF THE INVENTION

The present invention disclosed and claimed herein, in one aspect thereof, comprises architecture for enhancing encoding/decoding information of a channel. A stream of incoming information bits are arranged into a first array of information bits. The first array of information bits are processed into a first code of bits, which bits form a plurality of first code words having a minimum distance to neighboring error events. Selected bits of the first code are rearranged into a second array of bits by intermittent successive rotations of the selected bits of the first code. A second code is then generated from the second array of bits to increase the minimum distance to the neighboring error events.

In another aspect thereof, the stream of incoming information bits into a first array of information bits, wherein the first array of information bits is processed into a first TPC of bits, which first TPC includes a first set of column parity bits and a first set of row parity bits. The first array of information bits of the first code is then arranged into a second array of bits in a pseudo-random manner, and from which a second set of column parity bits and a second set of row parity bits are generated from the second array of bits. The first TPC, the second set of column parity bits, and the second set of row parity bits are then transmitted.

In still another aspect thereof, the stream of incoming information bits are arranged into a first array of k-by-k information bits. The first array of information bits are then processed into a first code of bits, which first code of bits form an $(n+1,k)^2$ TPC of Extended Hamming code words, and which first code has k columns that include the information bits. Selected bits of the first code are then rearranged into a second array of bits by rotating the k columns of the first code in a successively increasing manner. A second code is then generated from the second array of bits by encoding the k leftmost bits of each horizontal code word with a $(k+1,k)$ parity code word.

In yet another aspect thereof, the stream of incoming information bits into a first array of information bits, which first array of information bits are then processed into a first code of bits, which first code of bits form an $(n+1,k)^2$ TPC of Extended Hamming code words, and which first code has k columns that include the information bits. Selected bits of the first code are then rearranged into a second array of bits by rotating n columns of the first code in a successively increasing manner. A second code is then generated from the second array of bits by encoding the k leftmost bits of each horizontal code word with a $(n+1,n)$ parity code word.

In yet still another aspect thereof, the stream of incoming information bits into a first array of information bits, which first array of information bits is then processed into a first code of bits, the first code of bits forming a $(k+1,k)^2$ TPC of row elements and column elements. The first code is rearranged into a second array of bits such that the row elements and the column elements fall along corresponding diagonals. Encoding the second array of bits then generates a second code.

BRIEF DESCRIPTION OF THE DRAWINGS

For a more complete understanding of the present invention and the advantages thereof, reference is now made to the following description taken in conjunction with the accompanying Drawings in which.

DETAILED DESCRIPTION OF THE INVENTION

The disclosed architecture provides a class of codes that offer performance closer to Shannon's limit than the traditional concatenated codes. These codes, called Turbo Product Codes (TPCs), are the iterative soft decision decoding of a product code. TPCs are a class of codes with a wide range of flexibility in terms of performance, complexity, and code rate. This flexibility allows TPCs to be used in a wide range of applications. For example, one TPC considered exhibits a code rate of 4/5 and a coding gain of 7.4 dB at a bit error rate (BER) of $10^{-6}$.

The disclosed Concatenated Turbo Product Codes (C-TPCs) are built from existing TPCs, and enable an increase in a minimum distance that enables significantly improved performance in lower code rates. The following innovations when combined, enable the design of a wide range of C-TPCs that provide high performance while emphasizing low complexity to enable low-cost and high-speed implementations.

Figure 2:
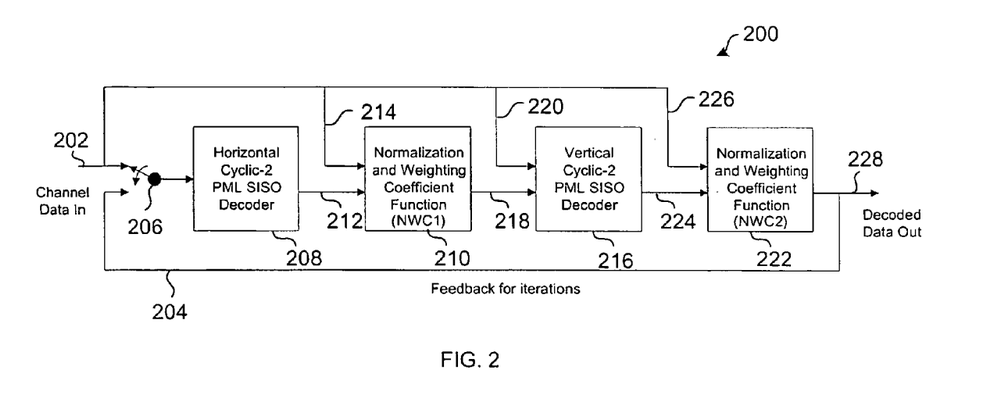
FIG. 2 illustrates a block diagram of a 2-dimensional TPC decoder, according to a disclosed embodiment.

Referring now to FIG. 2, there is illustrated a basic block diagram of a two-dimensional TPC decoder 200. The decoder 200 is two-dimensional in that data is processed in horizontal and vertical directions, and in this particular embodiment, utilizing Cyclic-2 PML SISO (Pseudo Maximum Likelihood Soft-Input Soft-Output) decoders.

In 1994, the applicant of this invention invented a new soft decision block decoding technique called Pseudo Maximum Likelihood decoding and its cyclic variations (in particular, the one called Cyclic-2 PML) that performs to within a few tenths of a dB (decibel) of maximum likelihood decoding, but with significantly reduced complexity. For many useful codes, this technique results in the most efficient deterministic decoders known. The details of this algorithm were published in the following proceedings, "PRAGMATIC APPROACH TO SOFT-DECISION DECODING OF LINEAR BLOCK CODES" by Thesling, W. H., IEE Proceedings on Communications 1995, the entirety of which is hereby incorporated by reference. A modification of the PML algorithm was subsequently developed to provide Soft-Output information resulting in a SISO decoder. The modification includes the development of a soft-output likelihood metric that is easily computed with the information readily available from the Cyclic-2 (C2) PML algorithm. The SISO C2-PML algorithm is disclosed in detail in U.S. Pat. No. 5,930,272 entitled "BLOCK DECODING WITH SOFT OUTPUT INFORMATION" by William H. Thesling, filed Jun. 10, 1997, and issued Jul. 27, 1999, the entirety of which is hereby incorporated by reference.

Referring again to FIG. 2, a first channel data input 202 to the decoder 200 accommodates channel data, and a second feedback input 204 accommodates feedback information. A selector circuit 206 moves between the first channel data input 202 and the second feedback input 204 to select the corresponding data for input to a first Cyclic-2 PML decoder 208. The first cyclic decoder 208 processes the rows (or horizontal bits) of the input code blocks, and passes decoded information therefrom to a first normalization-and-weighting-coefficient function (NWC) block 210 (also denoted NWC1) via a NWC1 input 212. The NWC1 block 210 performs the function of normalizing the received decoded data, and also developing a weighting coefficient for the code words. In order to perform this function, the NWC1 block 210 has a NWC1 raw data input 214 that connects to the first channel data input 202 to receive the raw channel data provided thereto.

The resultant data of the NWC1 block 210 is passed to a second Cyclic-2 PML SISO decoder 216 via a second decoder input 218, which second cyclic decoder 216 performs decoding of the columns (or vertical bits). The second decoder 216 also has a second raw data input 220 that connects to the first channel data input 202 to receive the raw channel data provided thereto.

The processed information of the second cyclic decoder 216 is passed to a second NWC block 222 (also denoted hereinafter as NWC2) via a NWC2 input 224 for performing normalization of the received decoded data, and also for developing a weighting coefficient for the code words. In order to perform this function, the NWC2 block 222 has a NWC2 raw data input 226 that connects to the first channel data input 202 to receive the raw channel data provided thereto. The output of the NWC2 block is output to decoded data output 228 for subsequent processing (not shown), and also fed back to the first cyclic decoder 208 via the feedback input 204. The feedback input 204 facilitates iterative processing of the data utilizing the decoder 200.

The performance of TPCs is quite good for the higher rate codes (rate $4/5^{th}$ and above) achieving performance approximately 1.2 B away from the Shannon' theoretical limit for a 4K block TPC at BER=$10^{-6}$. At lower BERs, the performance curves show a "flare." For example, the $(64,57)^2$ TPC achieves BER=$10^{-6}$ performance at Eb/No=3.2 dB. However, to achieve a BER of $10^{-10}$, an Eb/No of 4.2 dB is required. For applications requiring quasi error-free performance, the additional Eb/No required is significant.

To further increase the performance of TPCs in the lower BER realm, an enhancement is applied to TPCs that, in some ways, is similar to the concatenation of convolutional codes, but is constructed from Extended Hamming codes, and can be decoded with an efficient SISO decoding algorithm.

Figure 3:
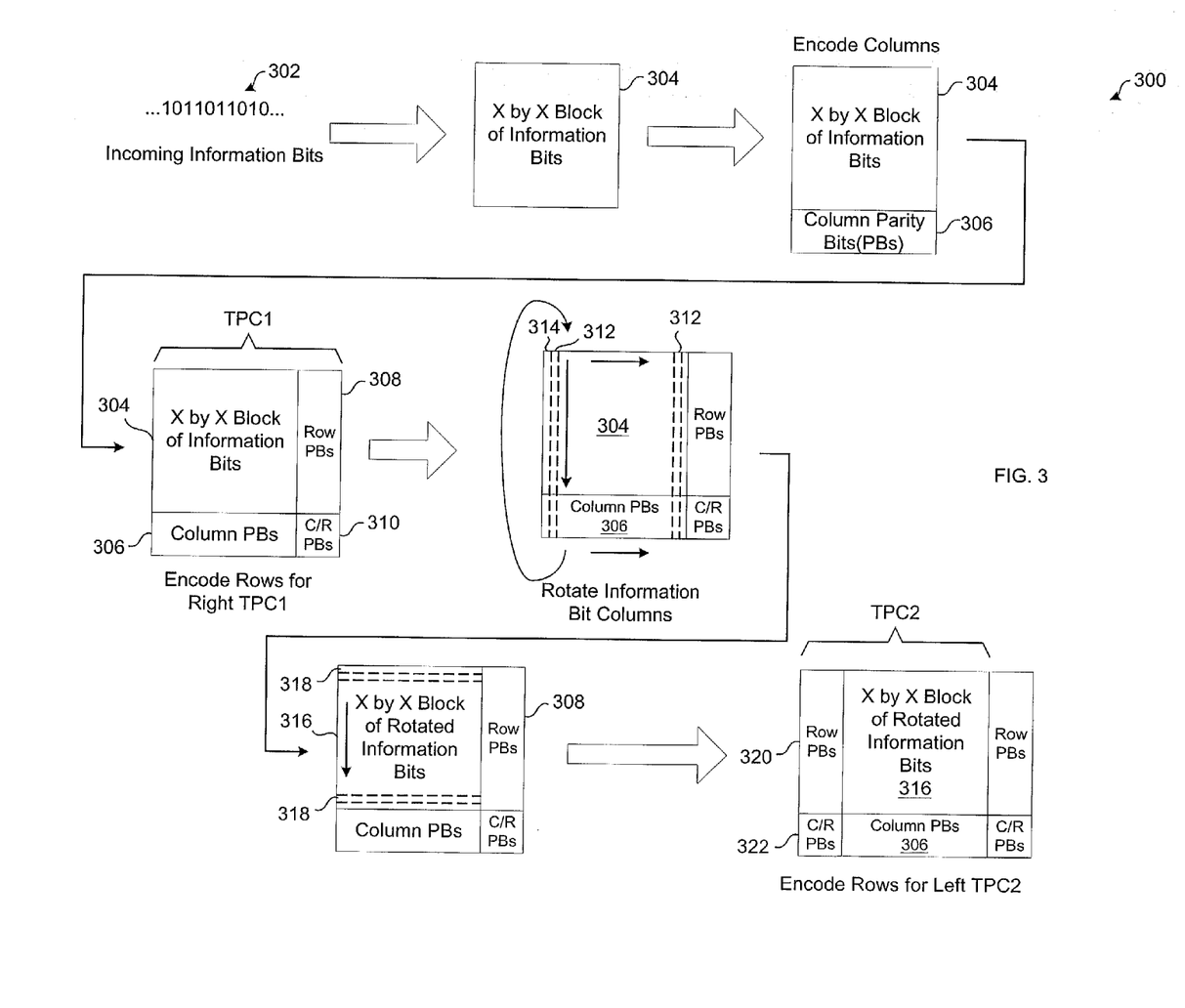
FIG. 3 illustrates the general process for developing a C-TPC utilizing Extended Hamming codes, according to a disclosed embodiment.

Referring now to FIG. 3, there is illustrated the general process 300 for developing a C-TPC utilizing Extended Hamming codes, according to a disclosed embodiment. The $(n+1,k)^2$ TPC of Extended Hamming code words has $n+1$ columns, of which k columns include the information bits and parity bits and, and $n+1-k$ columns include only parity bits. Similarly, the $(n+1,k)^2$ TPC has $n+1$ rows, of which k rows include the information bits and parity bits and, and $n+1-k$ rows include only parity bits.

Generally, the idea behind concatenated codes is to apply extra codes that are capable of identifying errors of the "parent" TPC. The encoding process 300 for generating a concatenated code begins with a channel of data comprising a stream of information bits 302. The stream of information bits 302 is formatted into a square matrix (or two-dimensional array) 304 of X-by-X information bits. The array 304 is then encoded top-to-bottom, and column by column, to derive parity bits for each column, which encoding process appends the set of corresponding column parity bits (PBs) 306 to the array 304. The next step is to then perform left-to-right row encoding on the array 304 and the recently derived column PBs 306, resulting in a set of row PBs 308 that include a set of parity bits for each row, and that are appended to the array 304 of information bits, and a corresponding set of row PBs 310 for the column PBs 306 (also denoted hereinafter as C/R PBs). Thus a first constituent code TPC1 is now defined by the array 304 of information bits, column PBs 306, row PBs 308, and C/RPBs 310. Note that the first code TPC1 is in the form of an Extended Hamming code where the row PBs 308 include one extra parity bit, which is the overall parity of row information bits and corresponding parity bits that define the code word for that row. Similarly, the column PBs 308 include one overall parity bit for each column of information bits and corresponding column parity bits that define the code word for that column.

The next step is to rearrange the array 304 of information bits and corresponding column PBs 306 by cyclically rotating columns 312 of information bits (only those columns that contain both information bits 304 and column PBs 306) in a successively increasing manner from left to right with an intermittent extra rotation for every $R^{th}$ column, where R is defined as the number of parity bits n–k in the Hamming code of (n,k) bits. That is to say that the bits of the first column are each shifted down one bit position, with the lowest bit wrapping around to the top position. The bits of the second column are each shifted down two bit positions, with the two lowest bits wrapping around to the top of the column in the array. Thus when the $R^{th}$ column is processed, the bits of the $R^{th}$ column are each shifted down R+1 positions with the bits wrapping around to fill the top positions of that column. Note that Hamming codes are cyclic, whereas Extended Hamming codes (codes that add one extra overall parity bit) are not. Thus when using Extended Hamming codes, column rotation is determined according to the Hamming code parameters. For example, in a (16,11) Extending Hamming code, the number of columns to rotate is based upon the (15,11) Hamming code, resulting in n–k=15–11=4 as R. Every $4^{th}$ column will then have an extra bit rotation, except for the leftmost information bit column 314. After the column rotation is complete, there exists an X by X rotated matrix 316 of rotated information bits. The rotated matrix 316 includes X columns of code words.

The next step is to create a second code (or left) TPC2 by encoding all of the rows 318 of rotated (or rearranged) information bits 316 and column PBs 306 (not the row PBs 308) from right to left to generate corresponding row PBs 320, and C/R PBs 322. The second (or left) constituent TPC2 is then defined by the rotated information bits 316, the left row PBs 320, the lower column PBs 306, and the lower left C/R PBs 322.

Figure 4:
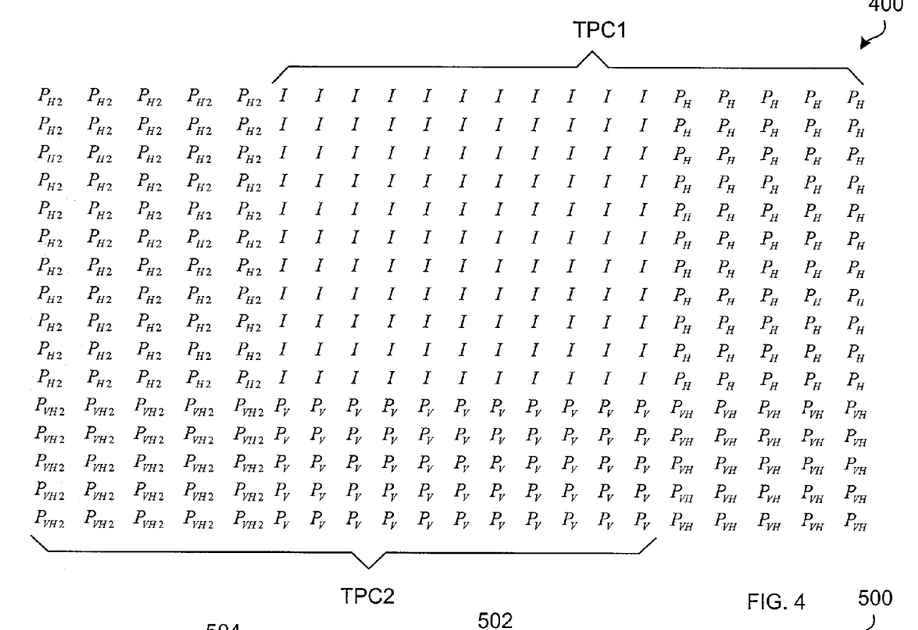
FIG. 4 illustrates a general layout of a concatenated (16,11) Extended Hamming code.

Referring now to FIG. 4, there is illustrated a general layout of a concatenated (16,11) Extended Hamming code 400. The rightmost sixteen columns form the first constituent $(16,11)^2$ code TPC1. Processing begins by downward encoding the columns of information bits (denoted as capital "I") to derive the corresponding column parity bits (denoted as capital "$P_V$") Next, processing the array of information bits and corresponding column PBs in a left-to-right fashion generates the five rightmost columns of parity bits for the first code TPC1 (denoted as "$P_H$" for the rows of information bits, and "$P_{VH}$" for the rows of encoded column parity bits "$P_V$"). The five leftmost columns of parity bits for the second code TPC2 (denoted as "$P_{H2}$" for the rows of encoded information bits, and "$P_{VH2}$" for the rows of encoded column parity bits "$P_V$") are generated in a manner similar to the five rightmost columns, in the first TPC1, except the code words (defined by the row information bits "I" and corresponding row parity bits "$P_{H2}$" are constructed in a right-to-left fashion. Therefore, each column of the twenty-one columns, in this particular embodiment, is a code word, and each row of the sixteen rows corresponds to two code words-the first code word involves the leftmost sixteen bits (i.e., five parity bits "$P_{H2}$" and eleven information bits "I", and the second code word involves the rightmost sixteen bits (i.e., the same eleven information bits "I" and five parity bits "$P_H$").

This concatenated code (i.e., the first code and the second code) can easily be decoded via an iterative decoding process. The code is now a (336,121) C-TPC with a rate=0.360. Note that the minimum distance of this code remains at sixteen. This suggests that the performance is worse then a (256,121) TPC by the rate difference (0.360 vs. 0.473, or 1.18 dB worse). (The associated performance curves are provided hereinbelow in FIG. 7.) However, the number of nearest neighbors (the number of possible weight sixteen error events) is drastically reduced. For the regular $(16,11)^2$ TPC1, when a weight sixteen error event occurs, the decoder must find four rows (code words) each with four bit errors. These four bit errors must be the same in the four positions in all four rows to assure four columns (code words) have four bit errors as well. A novel feature of the C-TPC is that the error pattern (which is itself a code word) of these four rows must also be an error pattern when the row is taken backwards, utilizing only the center eleven columns and the leftmost five parity bits.

For the (16,11) code, there are 1,240 weight-four code words. Thus there are $1,240^2$=1,537,600 possible weight-16 error events for the $(16,11)^2$ TPC. For the (16,11) code, there are only five weight-4 code words that are also code words when taken backwards. Thus there are 5×1,240=6,200 possible weight-16 error events for this (336,121) C-TPC.

However, this reduction in the number of nearest neighbor code words is insufficient to overcome the 1.18 dB of rate loss.

To further reduce the number of weight-16 error events, techniques reminiscent of the interleaver designs in TCCs (Turbo Convolutional Codes) are utilized. Here, a pseudo-random interleaver between the right constituent TPC1 (the sixteen rightmost columns) and the left constituent TPC2 (the sixteen leftmost columns) is used. As an example, consider the fact that the (15,11) Hamming code is a cyclic code. Therefore, the columns can be cyclically rotated (as per the (15,11) code) in any number of positions and still have a code word. Consequently, one can construct the second (left) TPC2, by "randomly" rotating the first eleven columns of the right constituent TPC1.

Consider a simple "random" rotation scheme where each successive column is rotated one more bit position then the previous column. This reduces the number of weight-16 code words to 5×5 (or 25). Only those weight-16 code words from the $(16,11)^2$ TPC1 which are completely a square symmetric, result in code words, as per the left C-TPC. All weight-16 code words can be eliminated if the columns are double rotated every $4^{th}$ column, which is depicted hereinbelow in FIG. 5. This array is only the left constituent TPC. The right constituent TPC is unchanged.

Figure 5:
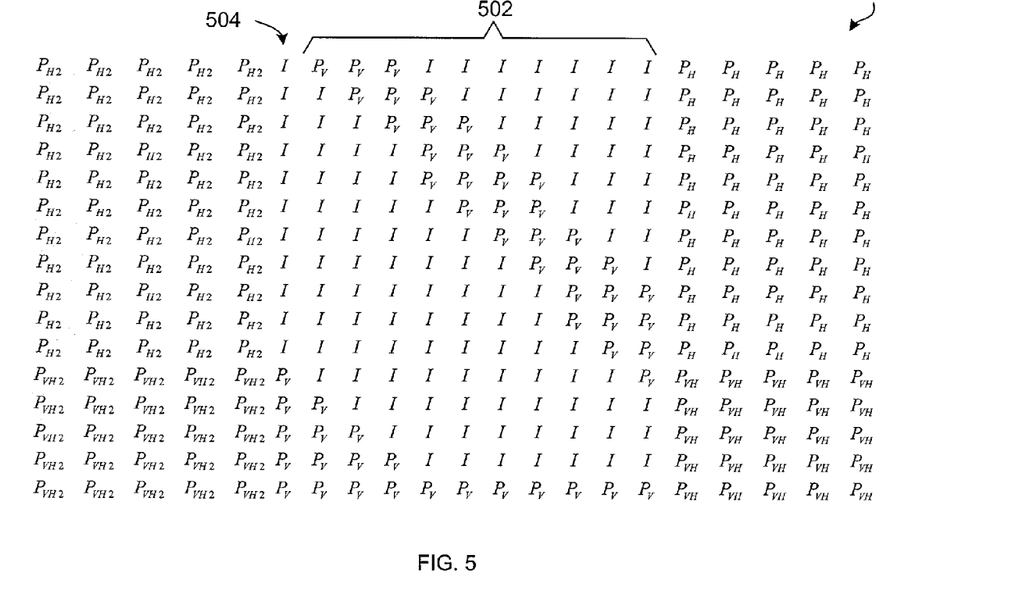
FIG. 5 illustrates the $(16,11)^2$ C-TPC of FIG. 4, showing the information bits being rotated.

Referring now to FIG. 5, there is illustrated the $(16,11)^2$ C-TPC 500 of FIG. 4, showing the information bits being rotated. Encoding begins with one hundred twenty-one information bits arranged in an 11×11 array, as illustrated in FIG. 4. First, the columns containing the information bits are downward encoded to derive the corresponding column parity bits "$P_V$", followed by the rows, to arrive at the standard (or right) TPC1 of FIG. 4. Then ten information bit columns 502 of the eleven are rotated in a successively increasing manner (from top to bottom) with an extra rotation every $4^{th}$ column (as depicted in FIG. 4). Note that the last (or leftmost) column 504 does not partake in this rotation operation, since only the Hamming code portion 502 is cyclic. After the "random" rotation is complete, there exist eleven column code words. Sixteen row code words are then generated in a right-to-left fashion to arrive at the left constituent TPC2.

Figure 6:
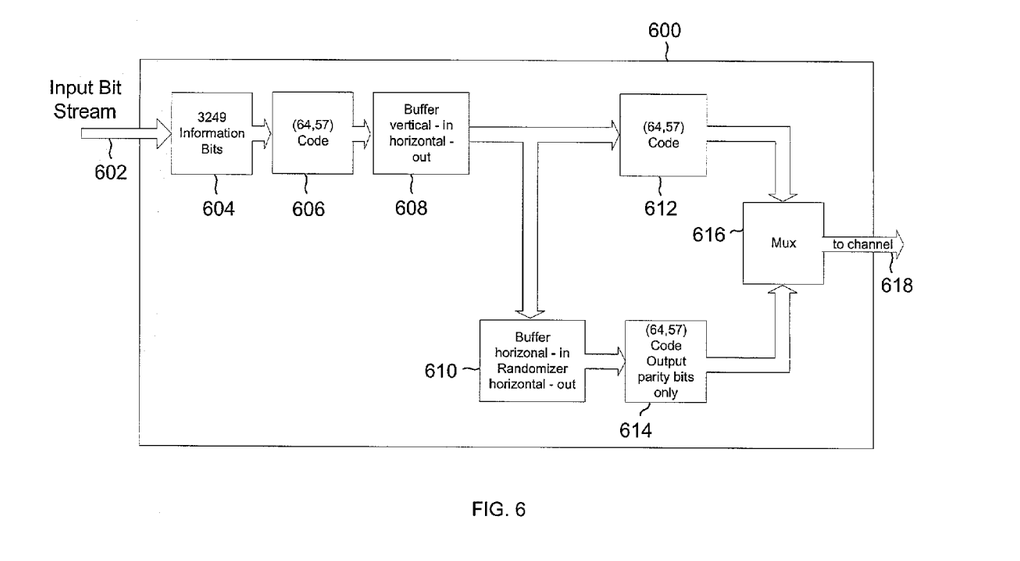
FIG. 6 illustrates a general circuit block diagram for an encoder for generating a (4544,3249) C-TPC from a (64,57) Extended Hamming TPC, according to a disclosed embodiment.

Referring now to FIG. 6, there is illustrated a general circuit block diagram for an encoder 600 for generating a (4544,3249) C-TPC from a (64,57) Extended Hamming TPC, according to a disclosed embodiment. The encoder 600 includes an input means 602 for receiving digital information that is to be encoded. The input 602 connects to a sampler 604 that samples a predetermined number of information bits needed to complete the particular information bit matrix, i.e., 57×57=3249 bits, and formats the 3249 information bits into a square array. The array of 3249 bits is then processed by columns into a (64,57) Extended Hamming Code by a TPC processing block 606. As indicated hereinabove, this process includes column encoding to append seven rows of column PBs to the lower bits of the matrix, for the (64,57) TPC, as generally represented in FIG. 3 by the array 304 of information bits and the corresponding column PBs 306.

After the (64,57) Extended Hamming code is constructed by the processing block 606, the C-TPC needs to be constructed by completing row encoding. Thus data flow is to a first buffer 608 where the information bit columns and the corresponding column PBs 306 are read thereinto from the processing block 606. The contents of the first buffer 608 are then transmitted out to a second processing block 612 where row encoding occurs in a left-to-right manner such that the rows of the array 304 of information bits and corresponding column PBs 306 are utilized to arrive at the row PBs 308 and the C/R PBs 310. This processing step of the second processing block 612 culminates with defining the first constituent TPC1, as illustrated in FIG. 3.

The contents of the first buffer 608 are also passed to a second buffer 610 for "randomizing" of the information bits. The second buffer 610 receives the contents of the first buffer 608 by row, including both the array 304 of information bits, column PBs 306, row PBs 308, and C/R PBs 310. The array 304 of information bits and corresponding column PBs are then cyclically rotated by column utilizing a "staggered diagonal rotation" rotator according to the number of check bits, i.e., seven, such that each column (except the leftmost, since only the (63,57) Hamming code is cyclic), beginning with the second leftmost column, is successively rotated one bit position, except that every seventh column is rotated at least two bit positions.

The randomized contents of the second buffer 610 are then passed to a third processing block 614 where processing of the contents of the second buffer 610 continues with right-to-left encoding to arrive at the parity bits that will be used for the second constituent TPC2, i.e., both row PBs 320 and C/R PBs 322. The output of the third processing block 614 comprises both the row PBs 320 and C/R PBs 322, which are then fed to a multiplexer 616. The multiplexer 616 then multiplexes the contents of the second processing block 612 (i.e., TPC1) with both the row PBs 320 and C/R PBs 322 to output the concatenated code TPC2 information to a communication channel 618.

Note that bit "randomizing" can occur in a variety of ways. For example, the disclosed architecture includes, but is not limited to, the following randomizing techniques: performing right-to-left column rotation; rotation from both top-to-bottom, and bottom-to-top; and rotation indexing where each column is rotated an equal number of bit places N, however, the column associated with the number of parity check bits is rotated any number bit places except N.

The C-TPC has within it both serial and parallel code concatenation. Finding a "good" interleaver is made much simpler in accordance with the C-TPC due to the inherent structure of the codes, but is more difficult to solve in turbo convolutional codes.

Figure 7:
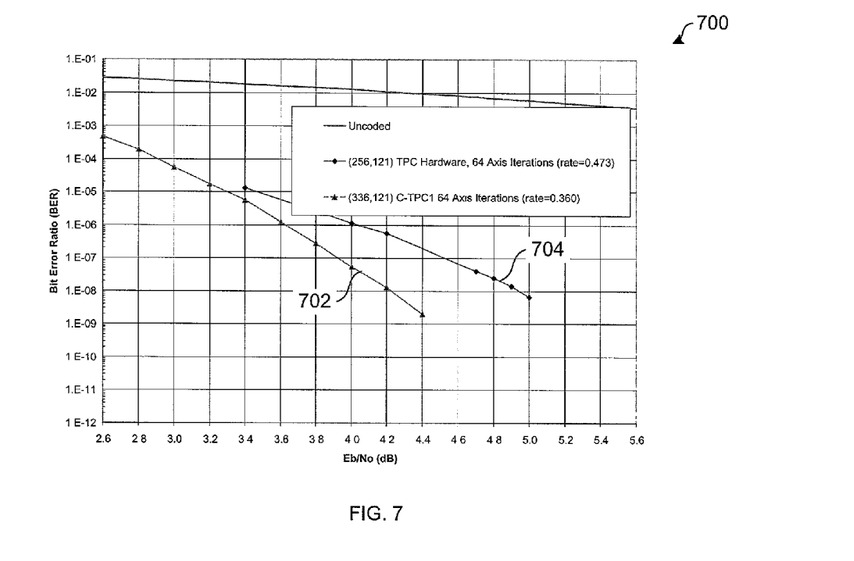
FIG. 7 illustrates a graph of simulated performance curves of the respective concatenated (336,121) TPC (C-TPC1) and the (256,121) "parent" TPC.

Referring now to FIG. 7, there is illustrated a graph 700 of simulated performance curves (702 and 704) of the respective concatenated (336,121) TPC (C-TPC1) and the (256,121) "parent" TPC. The performance curve 704 of the parent TPC was derived utilizing sixty-four axis iterations (rate=0.473) while the performance curve 702 for the concatenated code C-TPC1 was derived utilizing sixty-four axis iterations (rate=0.360). Note that the structure of the concatenated code C-TPC 500 depicted hereinabove in FIG. 5 increases the minimum distance from sixteen to twenty-four, thereby increasing the asymptotic coding gain (ACG) (with respect to the channel) by 1.76 dB. For the (336,121) Extended Hamming code, this represents an increase in ACG by a predicted value of 0.58 dB, when corrected for the rate loss. Notice that the ACG difference at BER=10$^{-8}$ exceeds the predicted value of 0.58 dB. This is due to the fact that the C-TPC1 code has fewer nearest neighbors, or fewer ways a 24-bit error even can occur then the (256,121) parent code has ways for a 16-bit error event to occur.

Figure 8:
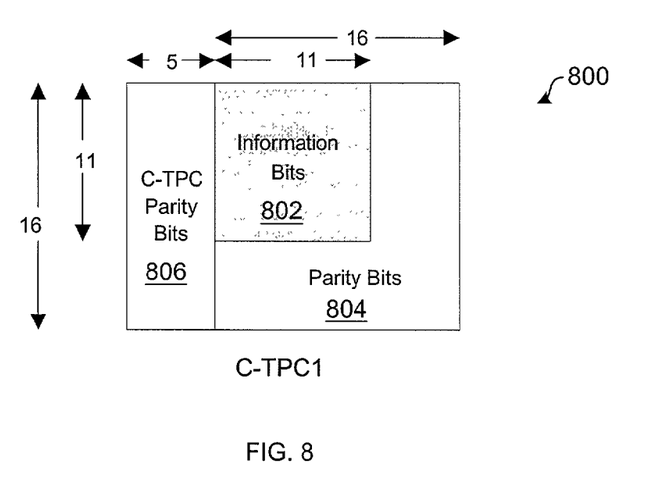
FIG. 8 and FIG. 9 illustrate a comparison of the relative size and structure of the (16,11) concatenated C-TPC1 and the (64,57) concatenated C-TPC2.
Figure 9:
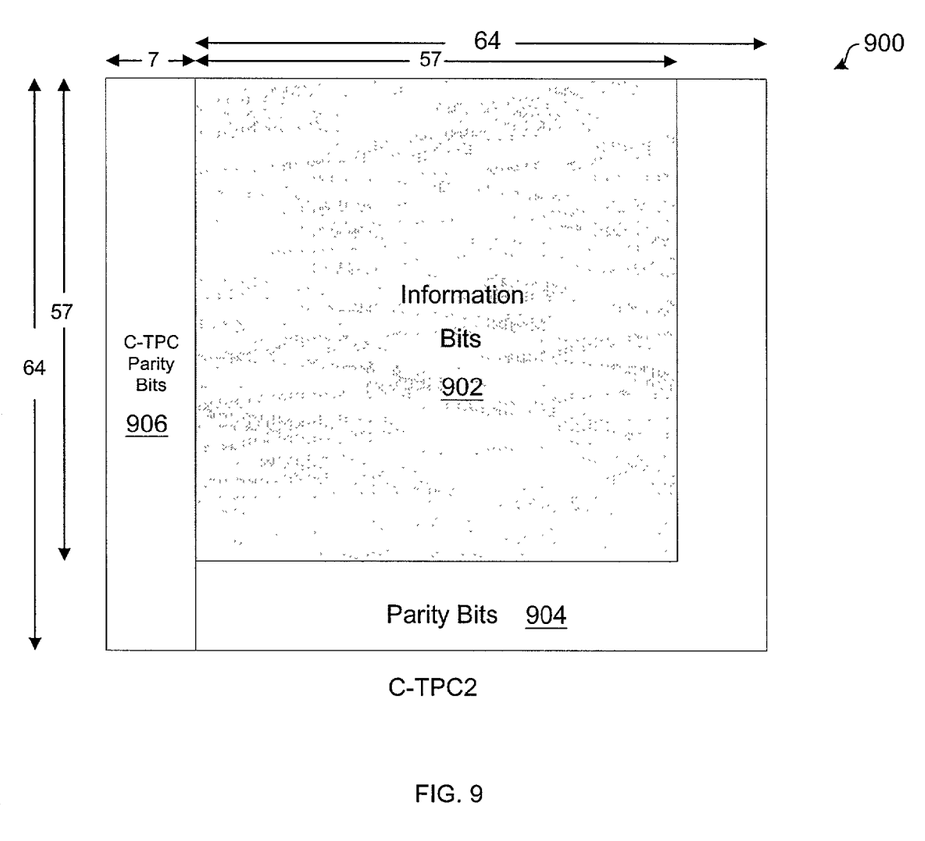

Referring now to FIG. 8 and FIG. 9, there is illustrated a comparison of the relative size and structure of the (16,11) concatenated C-TPC1 800 and the (64,57) concatenated C-TPC2 900. In FIG. 8, there is an 11×11 array 802 of information bits, the row, column, and C/R parity bits, inclusively denoted as "Parity Bits" 804, and concatenated parity bits 806 (that include both row parity bits, and C/R parity bits). In FIG. 9, there is a 57×57 array 902 of information bits; the row, column, and C/R parity bits, inclusively denoted as "Parity Bits" 904, and concatenated parity bits 906 (that include both row parity bits, and C/R parity bits).

Figure 10:
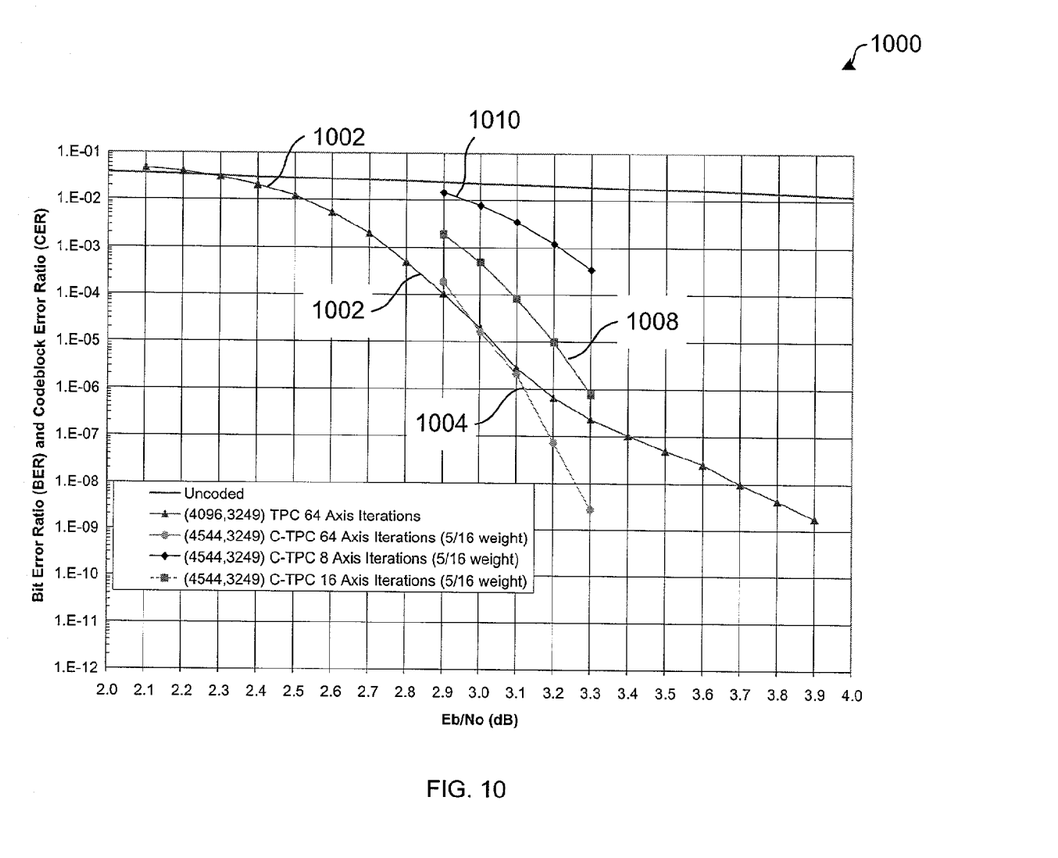
FIG. 10 illustrates a graph of the simulated performance curves for C-TPC2 900, and in comparison with the performance curve of the "parent" $(64,57)^2$ TPC.

Referring not to FIG. 10 there is illustrated a graph 1000 of the simulated performance curves for C-TPC2 900, and in comparison with the performance curve 1002 of the "parent" $(64,57)^2$ TPC. Note that the performance curve 1004 of C-TPC2 900 is the same, or slightly inferior to that of the parent $(64,57)^2$ TPC 1002, when making a comparison in a region above (or worse than) a BER of $10^{-5}$. However, for BERs that are below (better than) $10^{-5}$ (i.e., $10^{-6}$, $10^{-7}$, etc.) the performance curve 1004 of C-TPC2 900 shows substantial improvement. Utilizing the (64,57) Extended Hamming code in a similar design, the code rate of the overall C-TPC (4544,3249) (C-TPC2) is 0.715. This represents a rate loss (with respect to the $(64,57)^2$ TPC) of 0.45 dB. Thus the ACG for the (4544,3249) code would be better then the (4096, 3249) code by 1.31 dB, wherein ACG=10log10(24*3249/ 4544)−10log10(16*2349/4096)=12.34−11.03=1.31 dB.

This improvement comes about because the performance curve 1002 of the parent TPC is performing at its asymptotic limit curve, and thus exhibits a flaring effect 1006 at the lower (or better) BERs.

Note that the performance curve 1002 of parent TPC was generated utilizing sixty-four axis iterations. Three performance curves for the concatenated C-TPC2 are provided: the performance curve 1004 derived from sixty-four axis iterations (5/16 weight); a performance curve 1008 derived from sixteen axis iterations (5/16 weight); and a performance curve 1010 derived from eight axis iterations (5/16 weight).

What is known is that at the last simulation data point (where nine error events were logged), the number of bit errors per error event is large (approximately sixty). Since the minimum distance is only twenty-four, the asymptotic performance has not been reached. Although the performance at lower BERs is difficult to perform, if it is assumed that the number of nearest neighbors for C-TPC2 is similar to the number of nearest neighbors for the parent TPC $(64,57)^2$, then asymptotic performance in the BER=$10^{-12}$ to $10^{-13}$ range corresponding to Eb/No≈3.5 dB, can be reached.

Figure 11:
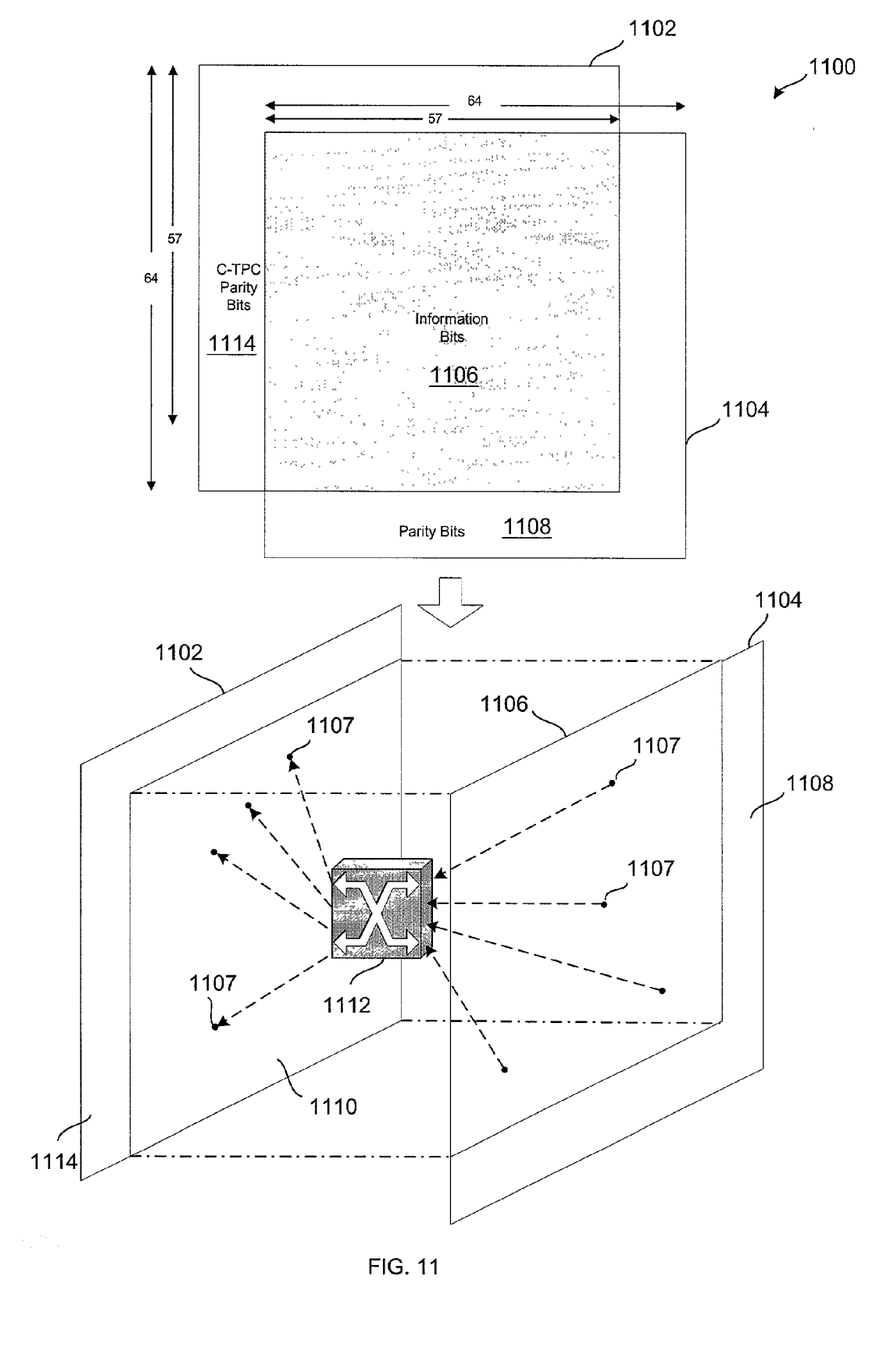
FIG. 11 illustrates a four-dimensional code embodiment achieved by adding an additional set of parity bits to the C-TPC2 of FIG. 9.

Referring now to FIG. 1, there is illustrated a four-dimensional code 1100 embodiment achieved by adding an additional set of parity bits 1102 to the C-TPC2 of FIG. 9. An improved code rate can be achieved by adding the additional set of parity bits 1102 to generate a (4983,3249) code, resulting in a code rate=0.657. A first of two versions of this code 1100 to be considered is a "random interleaver." In this case, the lower right TPC 1104 (including both the 57×57 array of information bits 1106 and the parity bits 1108) is constructed first. The array 1106 of information bits (various bits denoted by 1107) is then copied to a new 57×57 array 1110 of information bits in a pseudo random fashion using a random interleaver 1112. This new information bit array 1110 is then TPC-encoded from right to left, and bottom to top resulting in the upper left TPC 1102. The original TPC 1104 and the parity bits 1114 from the upper left TPC 1102 are then transmitted.

Figure 12:
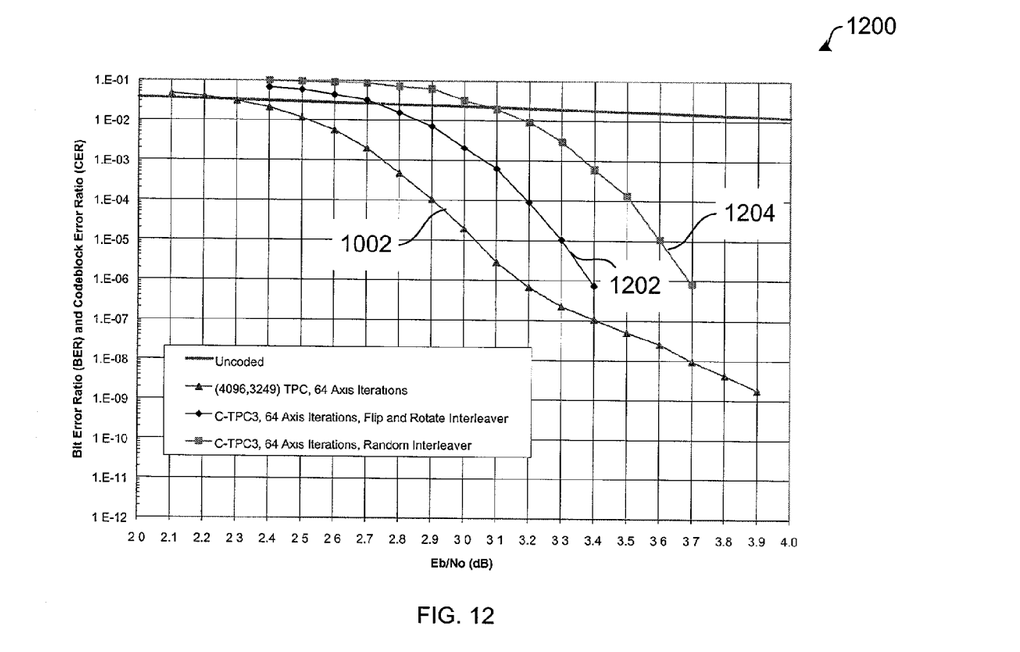
FIG. 12 illustrates a graph of the performance curve results for the code of FIG. 11.

Referring now to FIG. 12, there is illustrated a graph 1200 of the performance curve results for the code 1100 of FIG. 11. The performance curve 1002 for the parent (4096,3249) TPC was derived as before, with sixty-four axis iterations. A performance curve 1202 represents the results for the concatenated code C-TPC3 when utilizing a flip-and-rotate interleaver with sixty-four axis iterations. A performance curve 1204 represents the results for the concatenated code C-TPC3 when utilizing the random interleaver 1112 of FIG. 11 with sixty-four axis iterations. The C-TPC3 rate is approximately 0.657 and the parent TPC rate is approximately 0.793.

Figure 13:
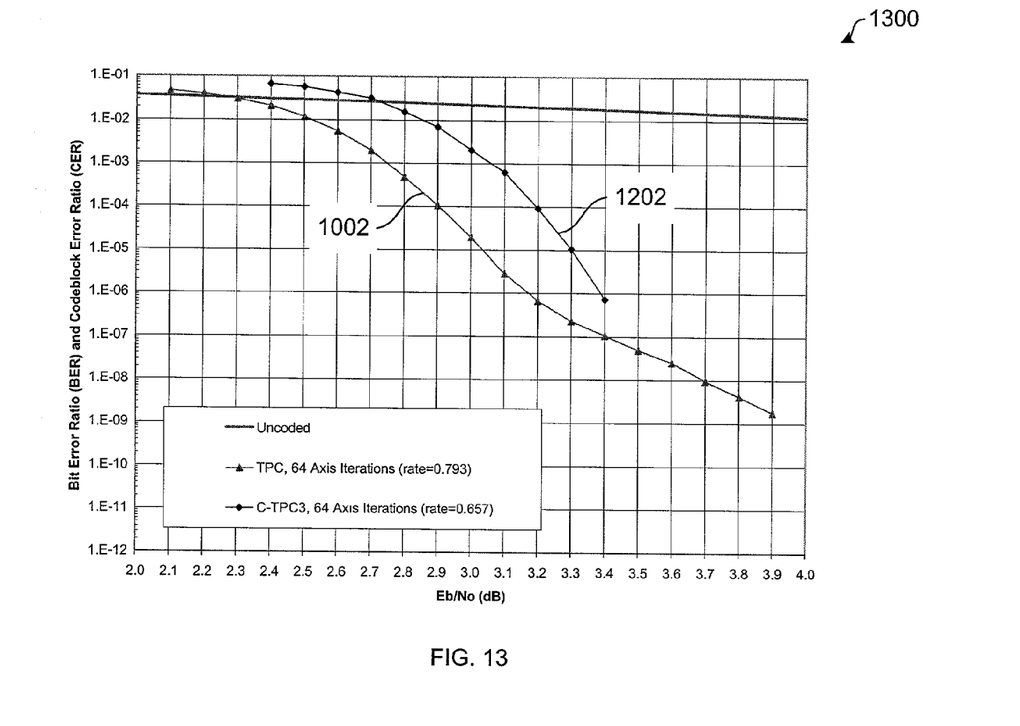
FIG. 13 illustrates a graph of the simulated performance results for C-TPC3 utilizing a staggered rotations interleaver.

In the second version of the C-TPC design, the information bits are "scrambled" using the same "staggered diagonal rotation" interleaver as per C-TPC2. A graph 1300 of the simulated performance results is shown in FIG. 13. The performance curve 1002 for the parent (4096,3249) TPC was derived as before, with sixty-four axis iterations, and has a code rate of 0.793. The performance curve 1202 represents the results for the concatenated code C-TPC3 when utilizing a flip-and-rotate interleaver with sixty-four axis iterations, and has a code rate of 0.657. Note that the performance of this variant of C-TPC3 is superior to the performance utilizing the random interleaver 1112. However, neither code outperforms C-TPC2 (which has a higher code rate of 0.715).

Figure 14:
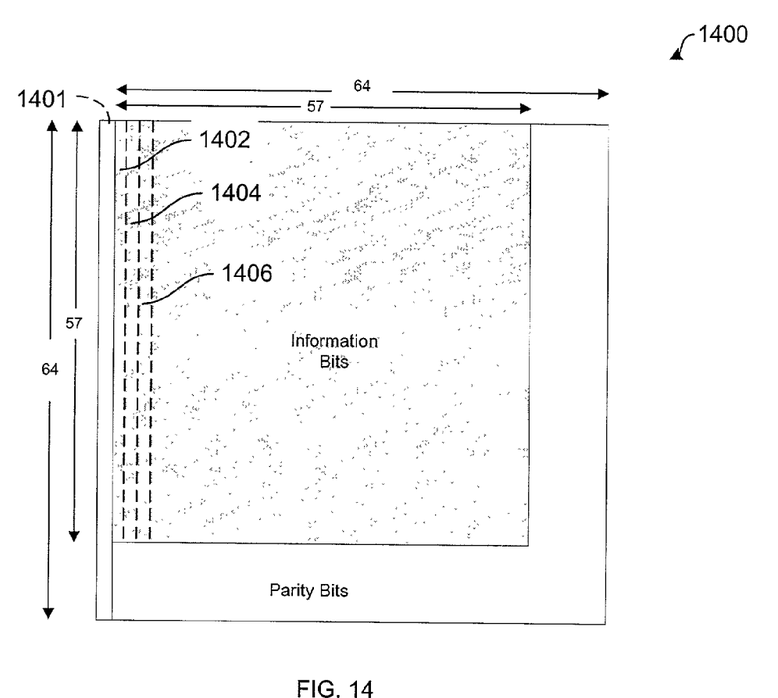
FIG. 14 illustrates the code C-TPC2 of FIG. 9 where an additional a parity bit is added.

Referring now to FIG. 14, there is illustrated the code C-TPC2 900 of FIG. 9 where one additional a parity bit is added instead of the multiple parity bits 906. Thus the additional concatenated code 1401 is a parity code. This yields a (4160,3249) code 1400. Two variants for this code 1400 are considered. In a first variant (C-TPC4), the fifty-seven leftmost columns of the parent $(64,57)^2$ are rotated (via the (63,57) Hamming code, only) in successive steps. For example, the first leftmost column 1402 is not rotated (since it is not part of the cyclical Hamming code (63,57)), the second leftmost column 1404 is rotated one position, the third leftmost column 1406 is rotated two positions, etc. By rotating only the fifty-seven leftmost columns, only the information bits and 6×57 (or 342 parity bits) partake in the "scrambling" operation. The fifty-seven leftmost bits per row (of which there are sixty-four rows) are then encoded with a (58,57) parity code. The resulting parity bits form the additional column 1401 that is a code word from the (64,57) Extended Hamming code. This column 1401 of sixty-four bits is then prepended to the left side of the array, as illustrated in FIG. 14.

For the second code variant (C-TPC5), which is not shown, the rotation operation was extended to sixty-three columns, and the parity code used is a (64,63) code. The $64^{th}$ column is purposely left out of the operation for the following reasons. First, rotating the final column one position more then the next-to-last column results in a full sixty-three-position rotation that is not changed from its original arrangement. (Recall that the last bit in an Extended Hamming code does not partake in the rotation operation since the Extended Hamming code is not a cyclic code; only the sixty-three bits that make up the Hamming code partake in the cyclic operation). Second, using a (k+1,k) code, where k is even, reduces the minimum distance of the concatenated code, since error locations associated with minimum-weight error events from the $(64,57)^2$ code can show up in even combinations when addressed diagonally (which is essentially what the rotating operations are doing). In this case, the (k+1,k) parity code will not "see" the errors.

Figure 15:
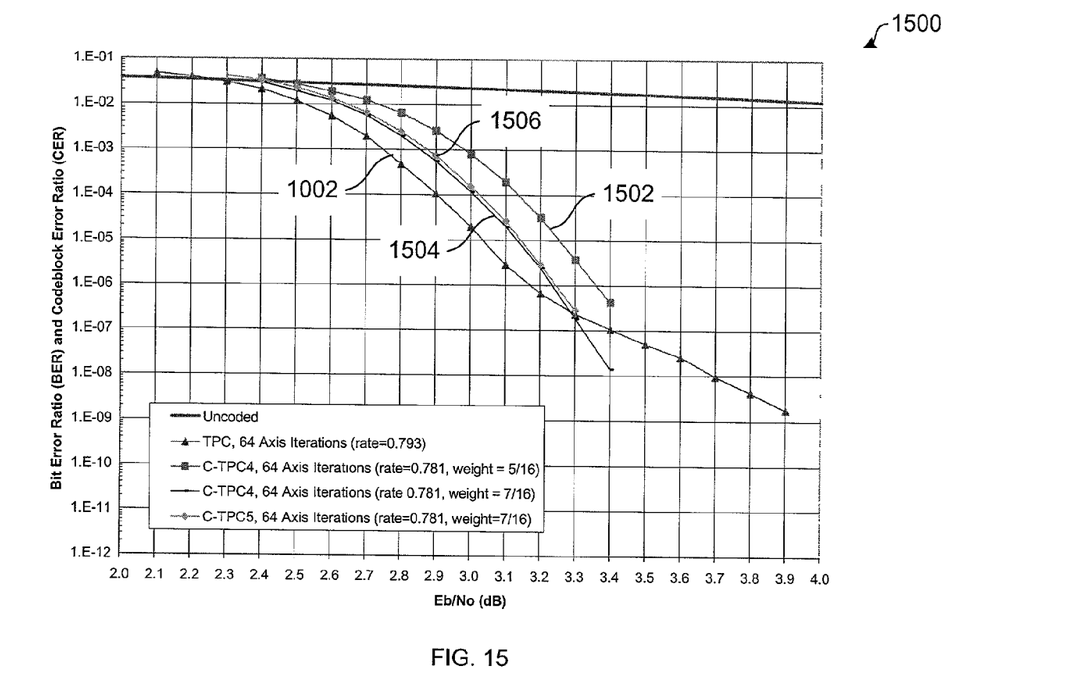
FIG. 15 illustrates a graph of the simulated performance curves for C-TPC4 and C-TPC5 utilizing various weighting coefficients.

Referring now to FIG. 15, there is illustrated a graph 1500 of the simulated performance curves for C-TPC4 and C-TPC5 utilizing various weighting coefficients. The parent performance curve 1002 was derived using sixty-four axis iterations to arrive at a code rate of approximately 0.793. The performance curve 1502 for C-TPC4 was derived using sixty-four axis iterations to arrive at a code rate of approximately 0.781 (with a weight of 5/16). The performance curve 1504 for C-TPC4 was derived using sixty-four axis iterations to arrive at a code rate of approximately 0.781 (with a weight of 7/16). The performance curve 1506 for C-TPC5 was derived using sixty-four axis iterations to arrive at a code rate of approximately 0.781 (with a weight of 5/16).

Note that the performance curves are very similar, and are slightly inferior to the performance of the parent code for BERs greater then $10^{-6}$, as indicated by the parent performance curve 1002. This is due to the average error event for the parent code in this performance realm exceeding the minimum distance of sixteen. The weaker parity code simply cannot correct such corrupted blocks. As the parent code begins to be dominated by minimum-weight error events, the parity code can identify the occurrence of these error events and supply "correcting power" for the iterative decoding process to lock in on the transmitted code word.

Though C-TPC4 and C-TPC5 perform substantially identically, the number of iterations associated with C-TPC5 is, on average, significantly reduced with respect to the number of iterations required for C-TPC4. For example, for Eb/No=3.3 dB, C-TPC4 requires forty iterations (on average) while C-TPC5 requires less then ten. This represents a four-fold reduction in complexity for the C-TPC5. The reason for the difference has to do with the way error events are corrected between code iterations. The extra (concatenated) parity bits 1401 associated C-TPC4 only cover the first fifty-seven columns. Because this covers all the information bits, it expands the minimum distance of the code from sixteen to twenty (as does C-TPC5). The parity bits from the (58,57) represent a relatively weak code. Upon completing SISO decoding for the (58,57) code, the metrics are modified only minimally, and the right seven columns are not modified at all. As such, the effect of modifying the metrics via the (58,57) code takes several iterations to "work through" to the seven rightmost columns. Only the single rightmost column is left out of the decoding updates via the (64,63) parity encoding for C-TPC5. This results in the faster convergence.

The minimum distance of this code C-TPC4 is twenty, resulting in an increase in the ACG of 0.9 dB, with respect to the parent $(64,57)^2$ TPC code. This is a reduction in the ACG from the C-TPC2, where the improvement in ACG is 1.31 dB. However the (4160,3249) code is of higher rate (rate=0.781). The C-TPC5 represents an excellent compromise between the performance of the C-TPC2 and the simplicity of the parent $(64,57)^2$ TPC. It is estimated that the asymptotic performance of the code is not reached until BER$\approx 10^{-11}$, which represents quasi error-free performance.

Figures 16, 17:
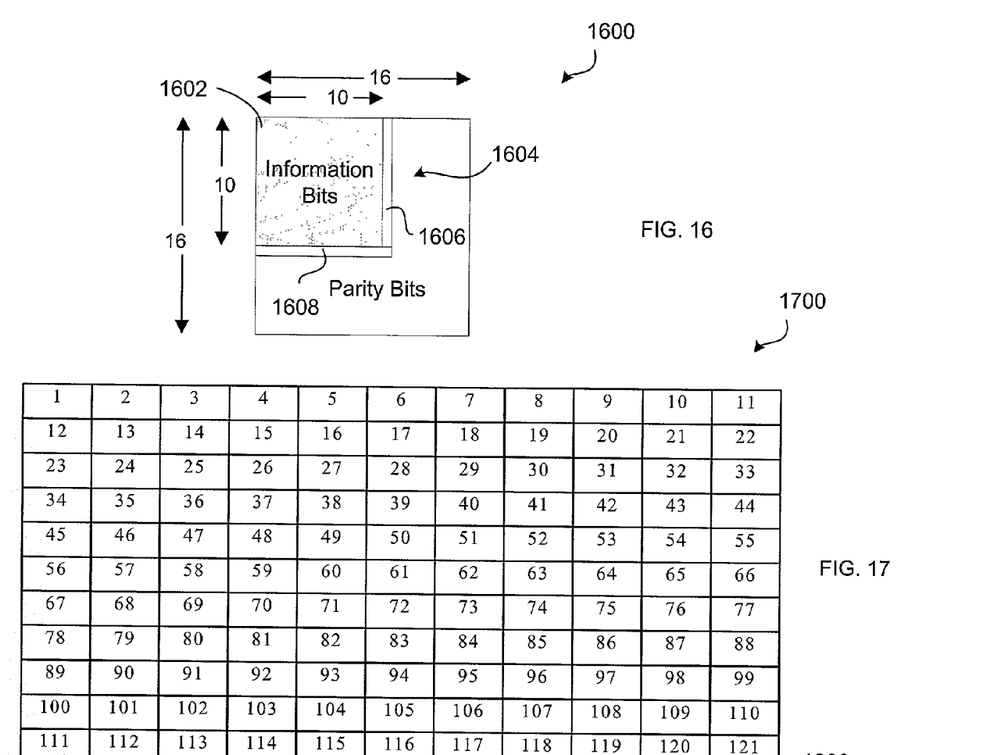
FIG. 16 illustrates a variation C-TPC8 of the C-TPC5 code that is considered whereby both diagonals are protected via parity codes.
FIG. 17 illustrates a simple indexing scheme of an 11×11 array representing the elements of the $(11,10)^2$ TPC.
Figure 18:
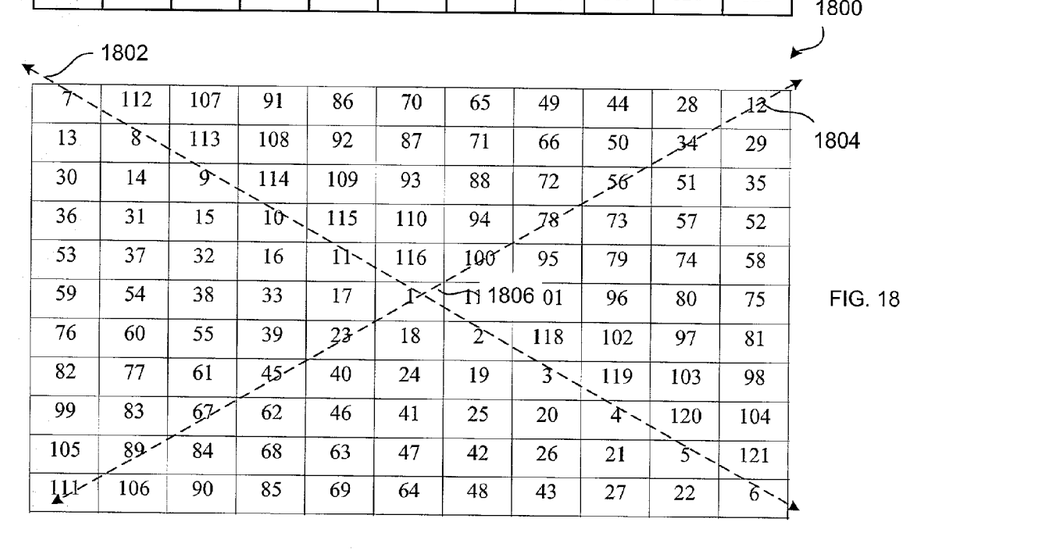
FIG. 18 illustrates a diagonal mapping of the elements of the array of FIG. 17 such that row and column elements fall along a first diagonal and a second diagonal, beginning the indexing at a center cell of the array and, working downward and to the right.

Referring now to FIG. 16, there is illustrated a variation C-TPC8 1600 of the C-TPC5 code that is considered whereby both diagonals are protected via parity codes. In this case, information bits 1602 correspond to an inner $(k+1,k)^2$ TPC 1604, where k+1 is the number of rows, and k is the number of columns. A single column 1606 of embedded parity bits and a single row 1608 of embedded parity bits complete this inner TPC 1604. In this particular example, the code 1600 includes one hundred twenty-one information bits that are obtained from a (121,100) TPC. The parity code words (rows and columns) need to fall on diagonals. To accomplish this, a $(11,10)^2$ TPC is first generated. A series of rotations are then performed to ensure that row and column elements fall along diagonals. An information bit array 1700 of FIG. 17 illustrates a simple indexing scheme of an 11×11 array representing the elements of the $(11,10)^2$ TPC. A "diagonal" array 1800 of FIG. 18 shows a diagonal mapping of the elements of the array 1700 of FIG. 17 such that row and column elements fall along a first diagonal 1802 and a second diagonal 1804, beginning the indexing at a center cell 1806 of the array 1800 and, working downward and to the right.

The diagonal mapping of the inner TPC 1604 before encoding via the outer TPC 1600 ensures that minimum-weight error events associated with the outer (256,121) TPC 1600 are easily identified via the inner (121,100) TPC 1604. This design increases the minimum distance of the overall code from sixteen to twenty-four.

Figure 19:
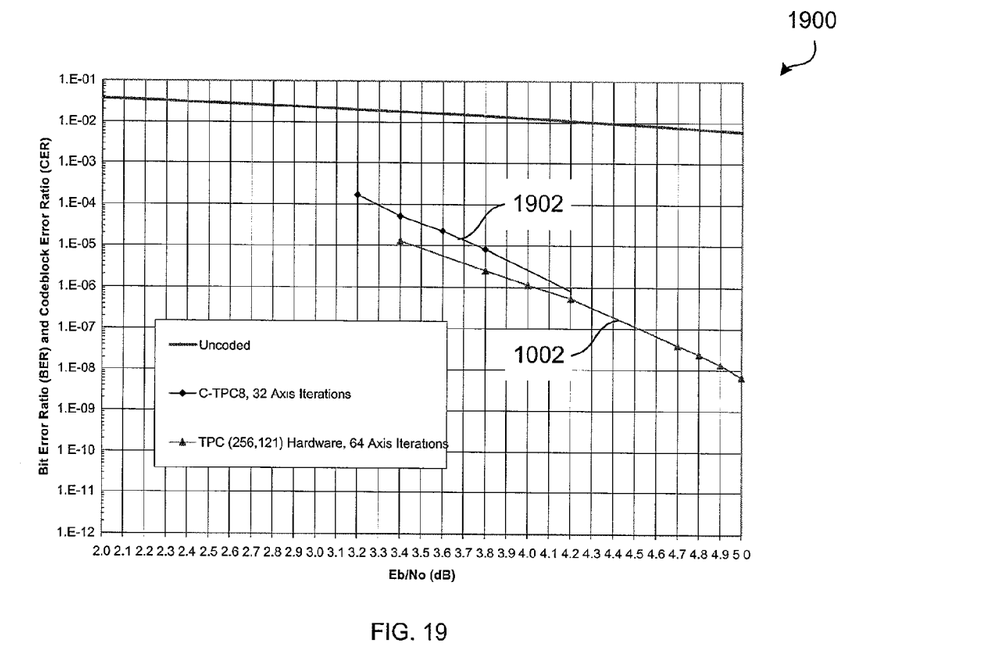
FIG. 19 illustrates a graph of simulated performance curves associated with the code of FIG. 16.

Referring now to FIG. 19, there is illustrated a graph 1900 of simulated performance curves associated with the code 1600 of FIG. 16. The performance curve 1002 of the parent (256,121) TPC is derived utilizing sixty-four axis iterations. A performance curve 1902 of the C-TPC8 concatenated code is derived using thirty-two axis iterations. Note that the C-TPC8 code under-performs the parent $(256,121)^2$ TPC. It is believed that there are a large number of neighbors for this code. The simulation results suggest that C-TPC8 will outperform its parent code at BERs<$10^{-8}$. However, this code design suffers 0.82 dB of rate loss due to the inner TPC 1604. This suggests that a C-TPC build with a higher rate parent code might perform better.

Figure 20:
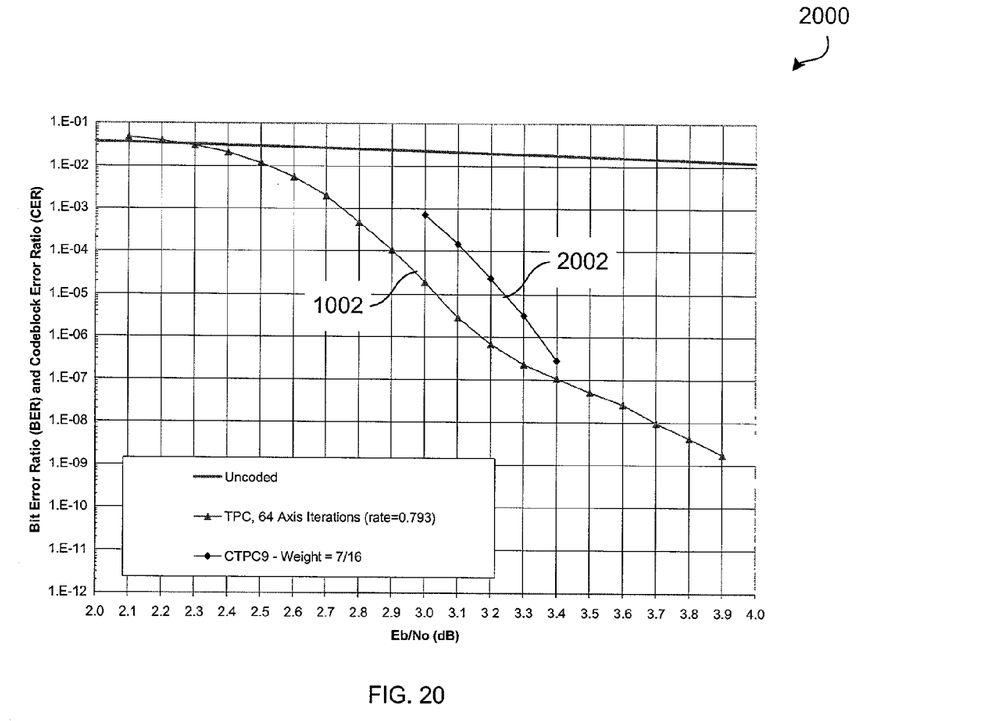
FIG. 20 illustrates a graph of simulated performance curves of a C-TPC9 $(64,57)^2$ code with various weighting coefficients.

A C-TPC9 code (not shown) is similar to the C-TPC8 code, but only constructed with the $(64,57)^2$ TPC as the parent code. This code has a higher rate (rate=0.766) and thus suffers less rate loss then the C-TPC8 code. The simulated performance results are shown in FIG. 20. The performance curve 1002 of the parent (256,121) TPC is derived utilizing sixty-four axis iterations to achieve a rate of approximately 0.793. A performance curve 2002 of the C-TPC9 concatenated code is derived using a weighting coefficient of 7/16.

The disclosed C-TPCs are can be implemented into a chip hardware architecture, and require columns for the channel input array, the coded output array, and the difference areas. Additionally, mechanisms for reading data from, and writing data into the working arrays are required.

A number of the C-TPC designs have been simulated, and appear to perform better then their parent TPC code at low bit error rates. Two designs, the C-TPC2 and C-TPC5, begin to show superior performance just as the code begins to exhibit asymptotic performance. This suggests that the disclosed C-TPC code is doing an excellent job of correcting these error events within the parent code. For codes that need to operate in the quasi error-free performance regimes (BERs$\approx 10^{-10}$ to $10^{-14}$), these C-TPCs represent some of the most powerful codes know with an elegant and efficient decoding method available with a demonstrated path to high performance implementation.

Although the preferred embodiment has been described in detail, it should be understood that various changes, substitutions and alterations can be made therein without departing from the spirit and scope of the invention as defined by the appended claims.

What is claimed is:

1. A method of encoding data of a data channel, the method comprising:

arranging a stream of incoming information bits into an information bit array;

processing the information bit array to generate a row of column parity bits;

encoding rows of the information bit array and rows of the column parity bits to generate a first row parity bits and a first column/row parity bits, wherein the information bit array, the column parity bits, the first row parity bits and the first column/row parity bits define a first Turbo Product Code;

randomizing the information bit array and the column parity bits by cyclically rotating columns of information bits to generate a rotated information bit array, wherein the randomizing includes utilizing rotation indexing where each column is rotated an equal number of bit places N, and wherein a column associated with a number of a parity check bits is rotated any number of bit places except N;

encoding rows of the rotated information bit array to generate a second row parity bits and a second column/row parity bits, wherein the rotated information bit array, the second row parity bits, the second column/row parity bits and the first column parity bits define a second Turbo Product Code.

2. A method of encoding data of a data channel, the method comprising:

arranging a stream of incoming information bits into a k-by-k array of information bits;

processing the k-by-k array of information bits by appending rows of column parity bits to lower bits of the array to form a (n+1, k) Extended Hamming Code, wherein the (n+1, k) Extended Hamming Code has k columns that include the information bits and has n+1-k rows that include only the column parity bits;

encoding rows of the (n+1, k) Extended Hamming Code to generate a first row parity bits and a second column/row parity bits, wherein the (n+1, k) Extended Hamming Code, the first row parity bits and the first column/row parity bits define a first Turbo Product Code;

randomizing selected bits of the (n+1, k) Extended Hamming Code into a randomized (n+1, k) Extended Hamming Code by rotating k columns of the (n+1, k) Extended Hamming Code in a staggered diagonal rotation, wherein the randomizing includes utilizing rotation indexing where each column is rotated an equal number of bit places N, and wherein a column associated with a number of a parity check bits is rotated any number of bit places except N;

encoding the randomized (n+1, k) Extended Hamming Code to generate a second row parity bits and a second column/row parity bits; and multiplexing the first Turbo Product Code with both the second row parity bits and the second column/row parity bits to generate a second Turbo Product Code.

3. An encoder configured to encode data of a data channel, the encoder comprising:

a sampler configured to arrange a stream of incoming information bits into a k-by-k array of information bits;

a processing block configured to process the k-by-k array of information bits by appending rows of column parity bits to lower bits of the array to form a (n+1, k) Extended Hamming Code, wherein the (n+1, k) Extended Hamming Code has k columns that include the information bits and has n+1-k rows that include only the column parity bits;

a second processing block configured to encode rows of the (n+1, k) Extended Hamming Code to generate a first row parity bits and a second column/row parity bits, wherein the (n+1, k) Extended Hamming Code, the first row parity bits and the first column/row parity bits define a first Turbo Product Code;

a rotator configured to randomize selected bits of the (n+1, k) Extended Hamming Code into a randomized (n+1, k) Extended Hamming Code by rotating k columns of the (n+1, k) Extended Hamming Code in a staggered diagonal rotation, wherein the rotator utilizes rotation indexing where each column is rotated an equal number of bit places N, and wherein a column associated with a number of a parity check bits is rotated any number of bit places except N;

a third processing block configured to encode the randomized (n+1, k) Extended Hamming Code to generate a second row parity bits and a second column/row parity bits; and a multiplexor configured to multiplex the first Turbo Product Code with both the second row parity bits and the second column/row parity bits to generate a second Turbo Product Code.

* * * * *

UNITED STATES PATENT AND TRADEMARK OFFICE
CERTIFICATE OF CORRECTION

| | | |
|---|---|---|
| PATENT NO. | : 7,107,505 B2 | Page 1 of 1 |
| APPLICATION NO. | : 10/109315 | |
| DATED | : September 12, 2006 | |
| INVENTOR(S) | : William H. Thasling, III | |

It is certified that error appears in the above-identified patent and that said Letters Patent is hereby corrected as shown below:

At col. 9, line 8, replace "Referring not to Fig. 10" with -- Referring now to Fig. 10 --.

At col. 9, line 45, replace "Referring now to Fig. 1" with -- Referring now to Fig. 11--.

Signed and Sealed this

Nineteenth Day of December, 2006

JON W. DUDAS
*Director of the United States Patent and Trademark Office*